United States Patent
Shibata et al.

(10) Patent No.: US 10,763,285 B2
(45) Date of Patent: Sep. 1, 2020

(54) IMAGE GENERATION DEVICES AND IMAGE PROCESSING SYSTEMS FOR CONVERTING RESOLUTIONS OF IMAGE DATA CAPTURED BY IMAGE SENSORS MOUNTED ON MOVABLE-BODY APPARATUSES

(71) Applicant: Panasonic Intellectual Property Management Co., Ltd., Osaka (JP)

(72) Inventors: Osamu Shibata, Hyogo (JP); Hiroshi Iwai, Osaka (JP); Kazuko Nishimura, Kyoto (JP); Yasuo Miyake, Osaka (JP); Yoshiaki Satou, Kyoto (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 16/293,823

(22) Filed: Mar. 6, 2019

(65) Prior Publication Data

US 2019/0198540 A1  Jun. 27, 2019

Related U.S. Application Data

(63) Continuation-in-part of application No. PCT/JP2017/032768, filed on Sep. 12, 2017.

(30) Foreign Application Priority Data

Sep. 29, 2016 (JP) .................................. 2016-191676

(51) Int. Cl.
*G06T 3/40* (2006.01)
*H04N 5/343* (2011.01)
(Continued)

(52) U.S. Cl.
CPC ...... *H01L 27/14605* (2013.01); *G06F 9/3004* (2013.01); *G06T 3/40* (2013.01);
(Continued)

(58) Field of Classification Search
CPC .... G06T 3/40; G06T 7/00; G06T 7/85; G06T 2207/30252; H04N 5/23229;
(Continued)

(56) References Cited

U.S. PATENT DOCUMENTS

| 8,791,835 | B2* | 7/2014 | Zhang | ................... G01S 5/0072 340/426.31 |
| 10,599,930 | B2* | 3/2020 | Lee | ........................... G06T 3/40 |
| 2016/0182866 | A1* | 6/2016 | Landqvist | ............... H04N 7/183 348/143 |

FOREIGN PATENT DOCUMENTS

| JP | 2003-018559 | 1/2003 |
| JP | 2007-081553 | 3/2007 |

(Continued)

OTHER PUBLICATIONS

International Search Report of PCT application No. PCT/JP2017/032768 dated Dec. 5, 2017.
(Continued)

*Primary Examiner* — Ngoc Yen T Vu
(74) *Attorney, Agent, or Firm* — Greenblum & Bernstein, P.L.C.

(57) ABSTRACT

An image generation device includes a receiver and a controller. The receiver receives travel information about the travel state of a movable-body apparatus. The controller selects, based on the travel information, a first partial region from an entirety of a plurality of pixels of an image sensor or an entirety of image data captured by the image sensor, and generates image data in which a region other than the first partial region has a resolution lower than the resolution
(Continued)

of the first partial region. The image sensor is to be mounted to the movable-body apparatus and is configured to capture an area in a traveling direction of the movable-body apparatus.

20 Claims, 12 Drawing Sheets

(51) Int. Cl.
    *H01L 27/146*     (2006.01)
    *H04N 7/18*     (2006.01)
    *G08G 1/16*     (2006.01)
    *G06T 7/00*     (2017.01)
    *H04N 5/232*     (2006.01)
    *G06T 7/80*     (2017.01)
    *G06F 9/30*     (2018.01)

(52) U.S. Cl.
    CPC .................. *G06T 7/00* (2013.01); *G06T 7/85* (2017.01); *G08G 1/16* (2013.01); *H04N 5/232* (2013.01); *H04N 5/23229* (2013.01); *H04N 5/23299* (2018.08); *H04N 7/18* (2013.01); *G06T 2207/20081* (2013.01); *G06T 2207/30252* (2013.01)

(58) Field of Classification Search
    CPC ........... H04N 5/23299; H04N 5/23218; H04N 5/343; G09G 1/16
    See application file for complete search history.

(56) References Cited

FOREIGN PATENT DOCUMENTS

| JP | 2007-266703 | * 10/2007 | ............... H04N 7/18 |
| JP | 2013-041481 | 2/2013 | |

OTHER PUBLICATIONS

Notice of Reasons for Refusal in Japan dated Mar. 31, 2020 for the related Japanese Patent Application No. 2016-191676, together with an English language translation.

* cited by examiner

FIG. 4

Compression level information

| Compression LV | Compression ratio | Number of pixels |
|---|---|---|
| 1 | 1 | 640×360 |
| 2 | 1/2 | 640×180, 320×360 |
| 3 | 1/4 | 320×180 |
| 4 | 1/4 | 640×90 |
| 5 | 1/8 | 320×90 |

FIG. 6

| Resolution before compression | 1920x1080 |
|---|---|
| Resolution after compression | 1280x630 |
| Segment matrix | 3x3 |
| Horizontal segment resolutions | 320, 640, 320 |
| Vertical segment resolutions | 90, 180, 360 |

Before end of uphill

| Resolution before compression | 1920x1080 |
|---|---|
| Resolution after compression | 1280x630 |
| Segment matrix | 3x3 |
| Horizontal segment resolutions | 320, 640, 320 |
| Vertical segment resolutions | 90, 360, 180 |

Traveling straight

| Resolution before compression | 1920x1080 |
|---|---|
| Resolution after compression | 1280x630 |
| Segment matrix | 3x3 |
| Horizontal segment resolutions | 320, 320, 640 |
| Vertical segment resolutions | 90, 360, 180 |

Steering right

| Resolution before compression | 1920x1080 |
|---|---|
| Resolution after compression | 1280x630 |
| Segment matrix | 3x3 |
| Horizontal segment resolutions | 320, 640, 320 |
| Vertical segment resolutions | 360, 180, 90 |

Before end of downhill

| Resolution before compression | 1920x1080 |
|---|---|
| Resolution after compression | 1280x630 |
| Segment matrix | 3x3 |
| Horizontal segment resolutions | 640, 320, 320 |
| Vertical segment resolutions | 90, 360, 180 |

Steering left

IMAGE GENERATION DEVICES AND IMAGE PROCESSING SYSTEMS FOR CONVERTING RESOLUTIONS OF IMAGE DATA CAPTURED BY IMAGE SENSORS MOUNTED ON MOVABLE-BODY APPARATUSES

CROSS-REFERENCE TO RELATED APPLICATIONS

This application is a continuation-in-part of the PCT International Application No. PCT/JP2017/032768 filed on Sep. 12, 2017, which claims the benefit of foreign priority of Japanese patent application No. 2016-191676 filed on Sep. 29, 2016, the contents all of which are incorporated herein by reference.

BACKGROUND

1. Technical Field

The present disclosure relates to an image generation device, an image generation method, a recording medium, and an image processing system.

2. Description of the Related Art

A technique for detecting an object from image data captured by an in-vehicle camera and a technique for reducing the image data are known. The image processing device disclosed in Japanese Patent Unexamined Publication No. 2013-041481 includes an image acquirer, a region setter, and a processor. The image acquirer obtains infrared image data. For an image region based on the infrared image data obtained by the image acquirer, the region setter sets a boundary line for segmenting the image region into two or more regions, and sets, as a pixel density changing region, at least one of the two or more regions obtained by segmenting along the boundary line. The processor performs a process for reducing the pixel density of the infrared image data in the pixel density changing region, performs an object detection process on the basis of the infrared image data in the image region including the pixel density changing region, and generates image data for display on the basis of the result of the detection process.

SUMMARY

The present disclosure provides an image generation device which appropriately compresses image data captured by a camera mounted to a movable-body apparatus. Furthermore, the present disclosure provides an image processing system which processes the image data compressed by the aforementioned image generation device.

One aspect of the present disclosure is directed to an image generation device including a receiver and a controller. The receiver receives travel information about the travel state of a movable-body apparatus. The controller select, based on the travel information, a first partial region from an entirety of a plurality of pixels of an image sensor or an entirety of image data captured by the image sensor, and generates image data in which a region other than the first partial region has a resolution lower than the resolution of the first partial region.

The image sensor is to be mounted to the movable-body apparatus and is configured to capture an area in a traveling direction of the movable-body apparatus.

The above-mentioned aspect may be any of a method, a program, and a non-transitory, tangible recording medium having a program recorded thereon.

Another aspect of the present disclosure is directed to an image processing system including the above-described image generation device and an image processing device which converts the resolution of image data.

According to the present disclosure, it is possible to provide an image generation device which appropriately compresses image data captured by a camera mounted to a movable-body apparatus. Furthermore, it is possible to provide an image processing system which processes the image data compressed by the aforementioned image generation device.

BRIEF DESCRIPTION OF DRAWINGS

FIG. 4 is a diagram illustrating compression level information.

FIG. 6 is a diagram illustrating image format information determined based on the travel information.

DETAILED DESCRIPTION OF PREFERRED EMBODIMENTS

Prior to describing an exemplary embodiment of the present disclosure, problems in the related art are described briefly. Japanese Patent Unexamined Publication No. 2013-041481 discloses setting at least one of a plurality of image regions as the pixel density changing region. However, image data captured by an on-vehicle camera which is a camera mounted to a vehicle which is an example of the movable-body apparatus is changing from moment to moment according to the travel of the vehicle, and thus reduction of the pixel density of a region set as the pixel density changing region is often inappropriate.

Hereinafter, an exemplary embodiment will be described with reference to the drawings.

Note that in the case where elements of the same type are differentiated in the description, reference marks may be used like "segment 200L" and "segment 200R", while in the case where elements of the same type are not differentiated in the description, only the common number in reference marks may be used like "segment 200".

Furthermore, structural elements (including elemental steps and the like) in the following exemplary embodiment are not necessarily essential except as otherwise particularly noted or considered obviously essential in principle.

<Overall Configuration>

Figure 1:
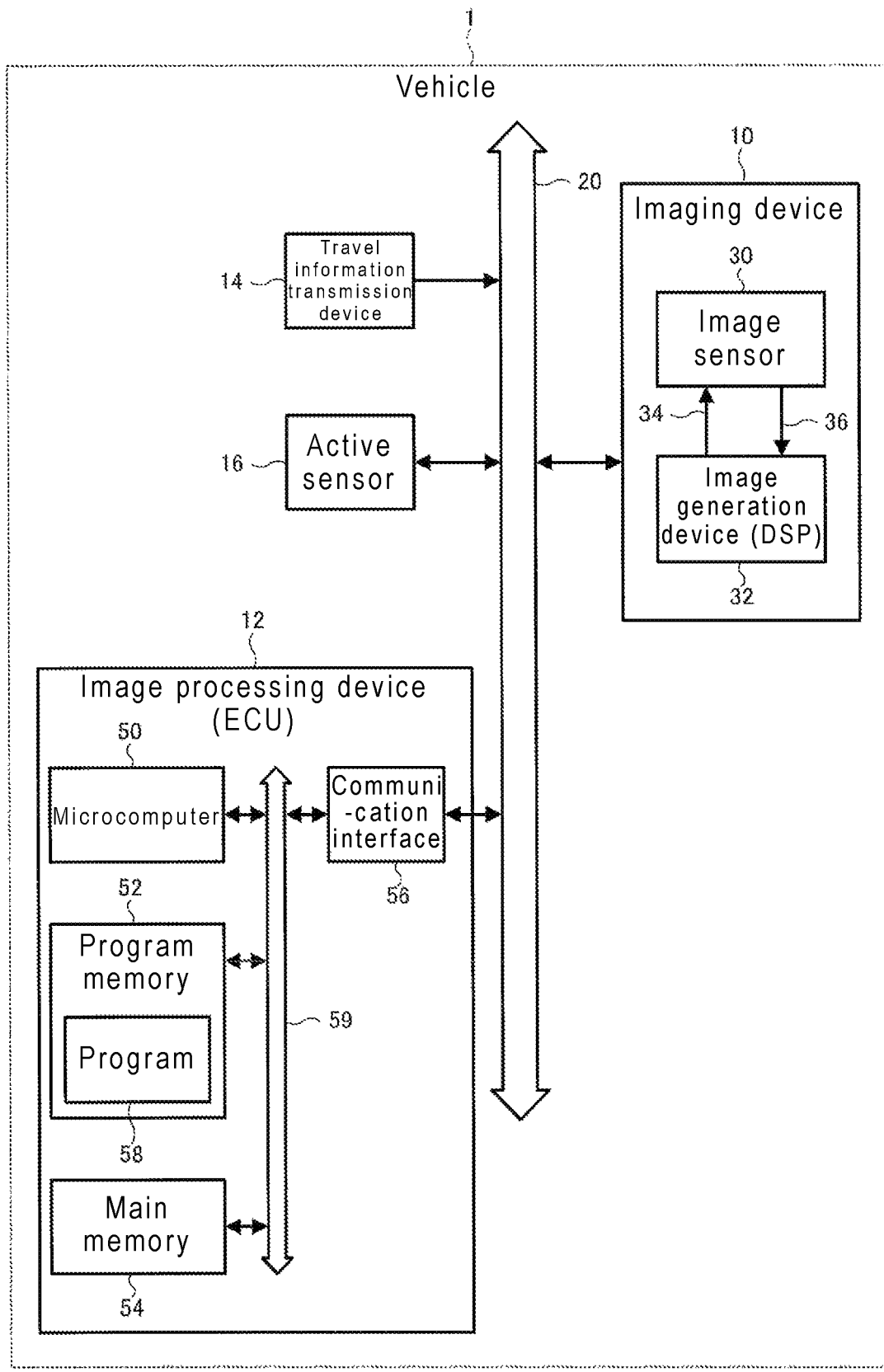
FIG. 1 is a diagram illustrating hardware configurations of an image generation device and an image processing device according to an embodiment of the present disclosure, and peripheral configurations thereof.

FIG. 1 is a diagram illustrating hardware configurations of an image generation device and an image processing device according to the embodiment of the present disclosure, and peripheral configurations thereof.

In a vehicle 1 which is an example of the movable-body apparatus, imaging device 10 including image generation device 32 according to the embodiment of the present disclosure, electronic control unit (ECU) 12 which is an exemplary embodiment of an image processing device according to the present disclosure, travel information transmission device 14, and active sensor 16 are connected via network 20. Network 20 can be configured, for example, by combining a controller area network (CAN) used to mainly transmit control signals and media oriented systems transport (MOST) or intelligent transport systems (ITS) data bus-1394 (IDB-1394) used to mainly transmit signals about multimedia. Note that vehicle 1 does not necessarily need to include, but may include only some of, all devices 10 to 16. Furthermore, in the case of one-to-one connection, a low-voltage differential signaling (LVDS) serial interface or the like may be used for connection.

Imaging device 10 is mounted to vehicle 1 and captures an image around (typically in a traveling direction of) vehicle 1. Imaging device 10 includes: image sensor 30; and digital signal processor (DSP) 32 which is an exemplary embodiment of an image generation device according to the present disclosure. A pixel signal output from image sensor 30 is input to DSP 32 via predetermined transmission path 36. Note that in a typical case where image sensor 30 transmits an analog image signal to DSP 32, an analog-to-digital converter (AD) (not illustrated in the drawings) is usually disposed between image sensor 30 and DSP 32. DSP 32 may output a control signal to image sensor 30 via predetermined transmission path 34. Details of imaging device 10 will be described later (refer to FIG. 2).

Travel information transmission device 14 transmits travel information including information about the travel state of a movable-body apparatus which is vehicle 1 or the like at a predetermined timing to imaging device 10 via network 20. A specific example of the travel information will be described later. Imaging device 10 determines a travel scene of the movable-body apparatus such as vehicle 1 on the basis of the received travel information. Examples of the travel scene of the movable-body apparatus such as vehicle 1 include traveling straight, steering right, steering left, turning right, turning left, having almost reached the top of an uphill, and having almost reached the bottom of a downhill. Details of travel information transmission device 14 will be described later.

In order to sense information around vehicle 1, active sensor 16 emits millimeter waves, waves of laser light, or the like, and measures, for example, the distance between vehicle 1 and an object around vehicle 1 (active sensor 16) based on return waves resulting from the waves being reflected by the object and returning to active sensor 16 itself.

ECU 12 controls each device connected to network 20. ECU 12 may include communication interface (I/F) 56, microcomputer 50, program memory 52, and main memory 54. Structural elements 50 to 56 may be capable of bidirectional communication via internal bus 59. In the case of one-to-one communication, unidirectional communication of information about image data is also applicable.

Communication I/F 56 controls data transmission and reception via network 20.

Program memory 52 holds program 58. Program memory 52 may be a non-volatile semiconductor memory such as an electrically erasable programmable read-only memory (EEPROM).

Main memory 54 stores various data regarding execution of program 58. Main memory 54 may be a volatile semiconductor memory such as a static random-access memory (SRAM) and a dynamic random-access memory (DRAM).

Microcomputer 50 implements various functions of ECU 12 by reading program 58 from program memory 52 and executing program 58 using main memory 54. Microcomputer 50 may be capable of transmitting and receiving data to and from other devices 10, 14, and 16 via communication interface 56 and network 20.

<Functional Configuration of Image Generation Device>

Figure 2:
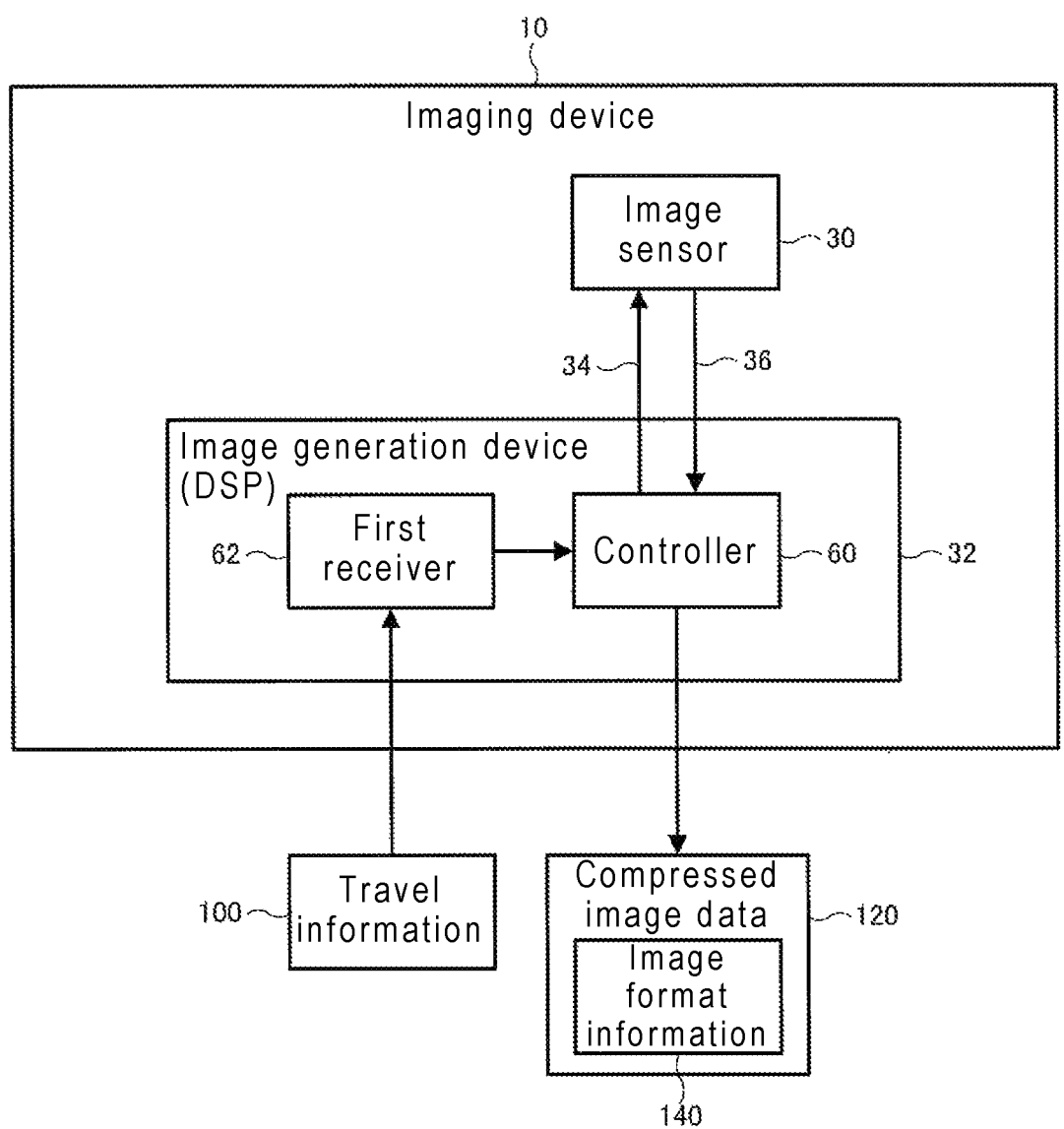
FIG. 2 is a diagram illustrating function blocks of the image generation device included in an imaging device.

FIG. 2 is a diagram illustrating function blocks of the image generation device included in imaging device 10.

Image sensor 30 in which a plurality of pixels 90 (refer to FIG. 3) each including a photoelectric conversion element are arranged sequentially outputs signals obtained by photoelectrically converting light incident on pixels 90. Image sensor 30 is, for example, a complementary metal oxide semiconductor (CMOS) image sensor or a charge-coupled device (CCD) image sensor. A signal output from image sensor 30 may be analog or may be digital. The unit of a single pixel may have a single black and white BW pixel configuration or may have a single color RGB pixel configuration, for example.

DSP 32 is an exemplary embodiment of the image generation device; DSP 32 includes first receiver 62 and controller 60 as functions. The functions of first receiver 62 and controller 60 may be provided as logic circuits such as a field-programmable gate array (FPGA) and an application specific integrated circuit (ASIC) or may be provided as programs.

First receiver 62 receives travel information 100 from travel information transmission device 14. Travel information 100 may be transmitted, as appropriate, by travel information transmission device 14 or may be obtained, as appropriate, by first receiver 62 from travel information transmission device 14.

Controller 60 controls reading-out of signals output from pixels of image sensor 30 based on travel information 100 received by first receiver 62. A control signal may be transmitted from controller 60 to image sensor 30 via transmission path 34, and pixel signals may be transmitted from image sensor 30 to controller 60 via transmission path 36. For example, controller 60 generates image data having a smaller number of pixels than the number of pixels of image data obtained when signals are read from all the pixels of image sensor 30 (more specifically, image data in which the resolution of a region other than the first partial region that is to be set based on travel information 100 is lower than the resolution of the first partial region), and outputs the image data to ECU 12 which is an exemplary embodiment of the image processing device, for example. Here, "setting" a partial region means, for example, "selecting" a portion from the entire region of the pixels of the image sensor, "selecting" a portion from the entire region of the image data, or the like.

Controller 60 may skip reading, at a predetermined interval, the pixels aligned on image sensor 30, so as to reduce the number of pixels of the image data to be output. Alternatively, controller 60 may read signals from all the pixels of image sensor 30 and compress the obtained image using a predetermined image compression algorithm (for example, moving picture experts group (MPEG)), to reduce the number of pixels of the image data to be output. In either case, the number of pixels of the image data to be output from DSP 32 is smaller than the number of pixels of image data obtained when signals are read from all the pixels of image sensor 30. In this way, it is possible to reduce the amount of data transmission (or the data transmission rate) of image data between imaging device 10 and ECU 12 which is an output destination. Note that image data that has a reduced number of pixels and is output from DSP 32 may be referred to as "compressed image data".

Here, each of the pixels of image sensor 30 belongs to one of a plurality of segments, and controller 60 may determine the resolution of each of segments 200 (refer to FIG. 3) based on travel information 100 received by first receiver 62. In the case where the first partial region is selected from the entirety of the image data, the entirety of the image data may be divided into a plurality of segments. For example, controller 60 determines the resolution of each of segments 200 based on travel information 100 so that the resolution of at least a part of a region other than the first partial region is lower than the resolution of the first partial region. Furthermore, controller 60 generates image data in which the resolution of one or more segments not belonging to the first partial region is lower than the resolution of one or more segments belonging to the first partial region. Hereinafter, description will be given with reference to FIG. 3 and FIG. 4.

Figure 3:
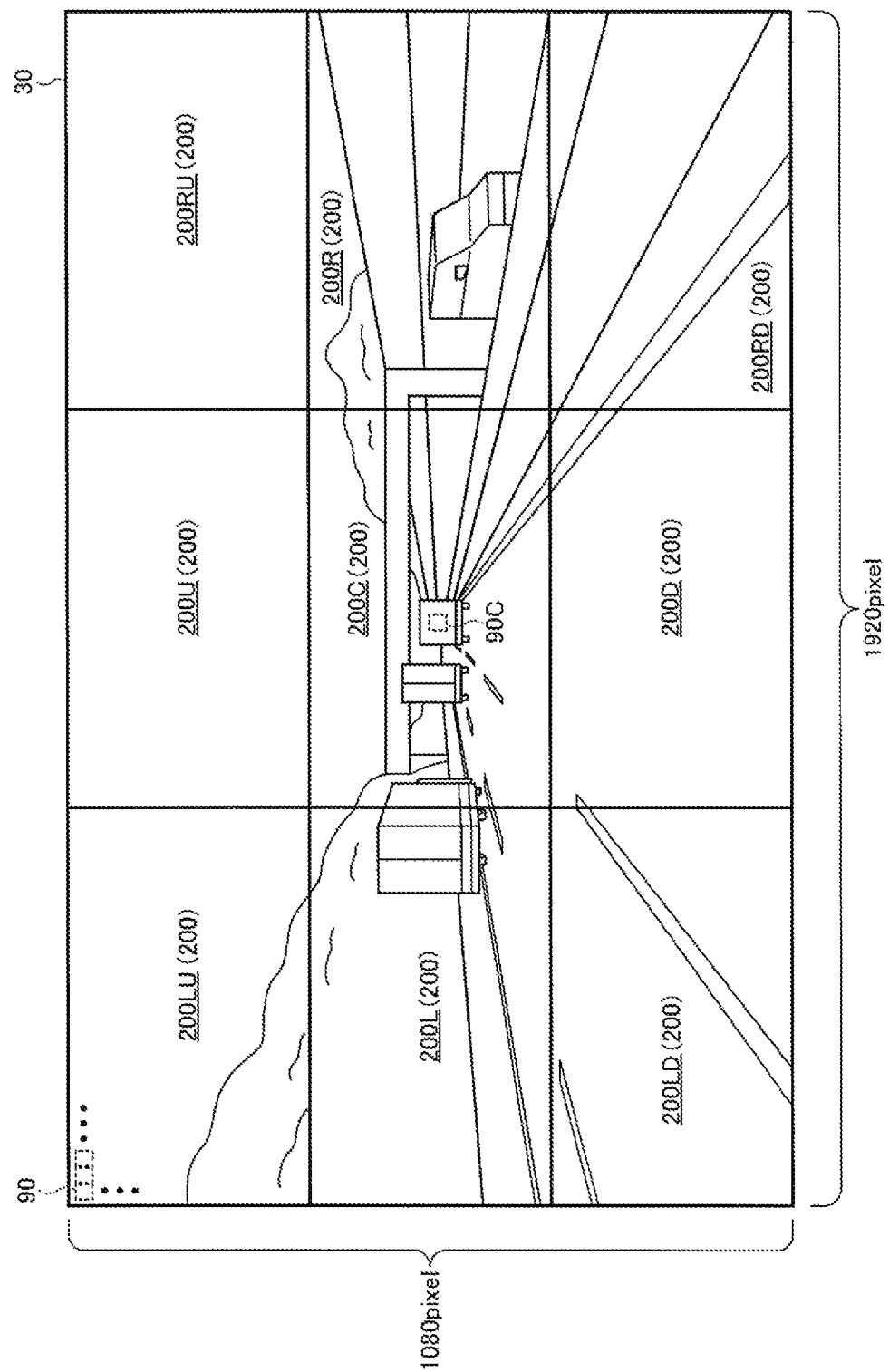
FIG. 3 is a diagram schematically illustrating segments configured for an image sensor.

FIG. 3 is a diagram illustrating segments 200 configured for image sensor 30.

FIG. 3 illustrates an example in which image sensor 30 including an array of pixels 90 that are 1920 pixels wide by 1080 pixels high (approximately 2,070,000 pixels), which corresponds to full high definition (HD), is divided into nine segments 200 by horizontally and vertically dividing the pixels into three equal portions. In this case, each segment 200 before compression is made up of 640 pixels wide by 360 pixels high (approximately 230,000 pixels). Note that although the resolutions (the numbers of pixels per unit length) of segments 200 before compression are the same in the present embodiment, segments 200 before compression may be made up of different numbers of pixels. For example, image sensor 30 may be divided in such a manner that the number of pixels in the segment at the center in FIG. 3 is greater than the number of pixels in each of other segments.

FIG. 4 is a diagram illustrating compression level information. A compression level (compression LV) to be applied for each segment 200 may be defined as the compression level information, as illustrated in FIG. 4. The compression level may be a compression ratio, the number of pixels, or the resolution of compressed data. Hereinafter, the compression level information in FIG. 4 will be described.

The number of pixels (in other words, the resolution) in a segment for which the compression level is determined as "1" is maintained (no compression is applied). In the example in FIG. 3, the resolution of a segment after compression is 640 pixels wide by 360 pixels high (approximately 230,000 pixels, which corresponds to "full HD").

The number of pixels (in other words, the resolution) in a segment for which the compression level is determined as "2" is reduced (compressed) by half. In the example in FIG. 3, the resolution of a segment after compression is 640 pixels wide by 180 pixels high or 320 pixels wide by 360 pixels high (approximately 115,000 pixels, which corresponds to "HD").

The number of pixels in a segment for which the compression level is determined as "3" is reduced (compressed) by one-fourth. In the example in FIG. 3, the resolution of a segment after compression is 320 pixels wide by 180 pixels high (approximately 57,000 pixels, which corresponds to "HD−").

The number of pixels in a segment for which the compression level is determined as "4" is reduced (compressed) by one-fourth. In the example in FIG. 3, the resolution of a segment after compression is 640 pixels wide by 90 pixels high (approximately 57,000 pixels, which corresponds to "standard definition (SD) +").

The number of pixels in a segment for which the compression level is determined as "5" is reduced (compressed) by one-eighth. In the example in FIG. 3, the resolution of a segment after compression is 320 pixels wide by 90 pixels high (approximately 28,000 pixels, which corresponds to "SD").

<Process for Determining Compression Level of Each Segment Based on Travel Information>

Figure 5:
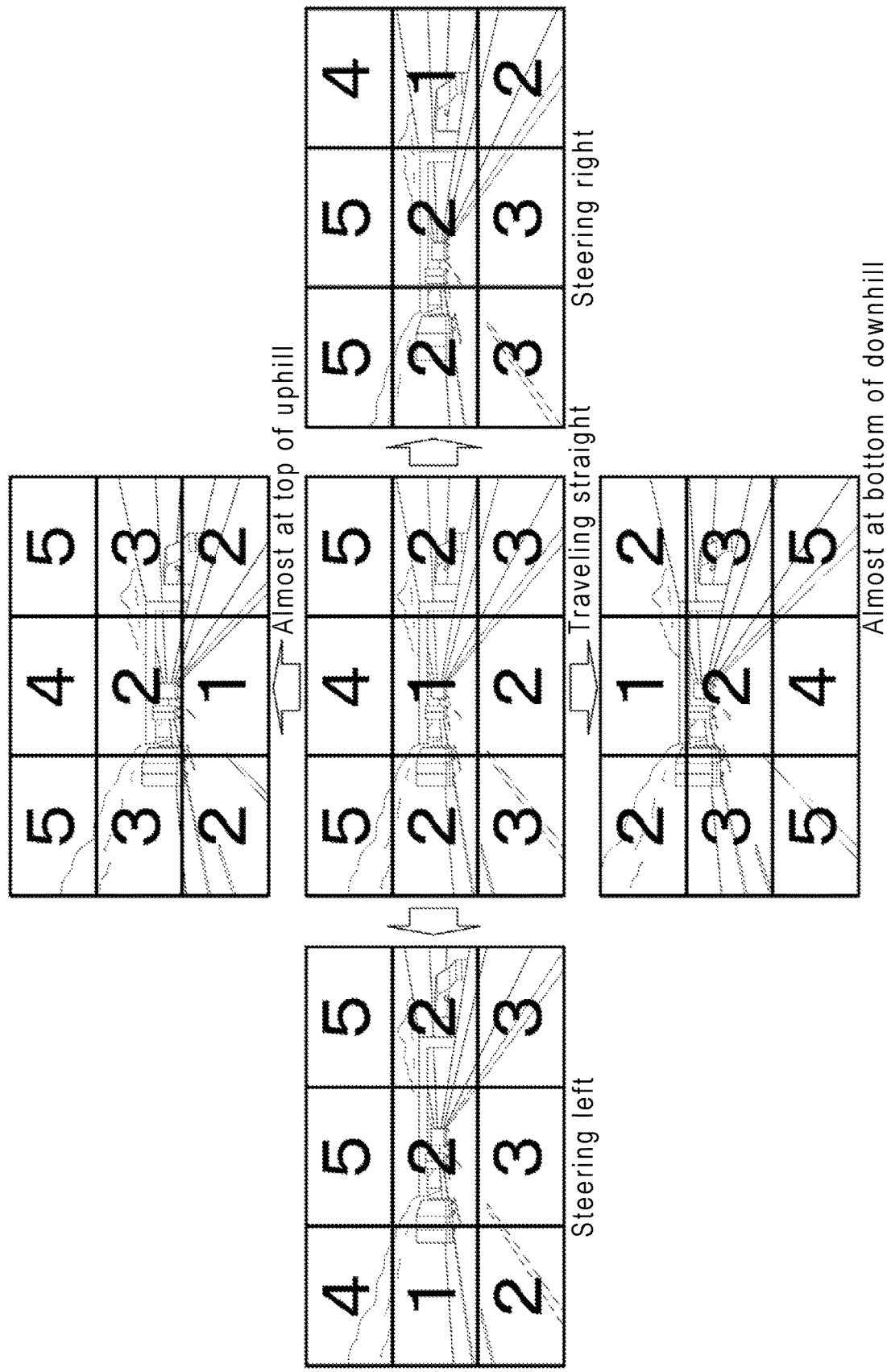
FIG. 5 is a diagram illustrating a compression level of each segment determined based on travel information.

FIG. 5 is a diagram illustrating the compression level of each segment 200 determined based on travel information 100.

Controller 60 determines, based on travel information 100 received by first receiver 62, which of "traveling straight", "steering right", "steering left", "almost at the top of an uphill", and "almost at the bottom of a downhill" the travel scene of vehicle 1 is.

Controller 60 may determine, based on travel information 100 including a steering angle transmitted by a steering angle sensor which is an example of travel information transmission device 14, which of "traveling straight", "steering right", and "steering left" the travel scene of vehicle 1 is. The steering angle may be an angle of a steering wheel of vehicle 1. For example, when the steering angle is between 0 degree and a predetermined first angle in a right or left turn direction, controller 60 may determine the travel scene as "traveling straight". When the steering angle is greater than the first angle and less than or equal to a predetermined second angle in the right turn direction, controller 60 may determine the travel scene as "steering right", and when the steering angle is greater than the first angle and less than or equal to the second angle in the left turn direction, controller 60 may determine the travel scene as "steering left".

Controller 60 may determine, based on travel information 100 including an angular velocity around a pitch axis, which of "almost at the top of an uphill" and "almost at the bottom of a downhill" the travel scene of vehicle 1 is or whether the travel scene of vehicle 1 is neither "almost at the top of an uphill" nor "almost at the bottom of a downhill" The angular velocity is transmitted by a gyro sensor which is an example of travel information transmission device 14. For example, controller 60 may determine the travel scene as "almost at the top of an uphill" when the angular velocity around the pitch axis indicates the forward rotation of vehicle 1, and determine the travel scene as "almost at the bottom of a downhill" when the angular velocity around the pitch axis indicates the rearward rotation of vehicle 1.

Note that controller 60 may determine the travel scene by other methods. For example, controller 60 may determine, based on travel information 100 including a slope angle ahead at the traveling spot of the vehicle, which of "almost at the top of an uphill" and "almost at the bottom of a downhill" the travel scene of vehicle 1 is or whether the travel scene of vehicle 1 is neither "almost at the top of an uphill" nor "almost at the bottom of a downhill" The slope angle is transmitted by a navigation device which is an embodiment of travel information transmission device 14

<When Determined as Traveling Straight>

When the travel scene is determined as traveling straight, controller 60 sets, as the first partial region, segment 200 of image sensor 30 that includes a pixel receiving at least light from straight ahead. Furthermore, controller 60 determines that the resolution of at least one segment 200 other than the first partial region is to be set lower than the resolution of the first partial region while maintaining the resolution of segment 200 for the first partial region. In other words, controller 60 may determine the compression ratio of each segment so that the compression ratio (which is, for example, the compression level; the same applies hereinafter) of segment 200 for the first partial region becomes lowest. This is because it is preferable that an object in front of vehicle 1 be accurately detected in a short time when vehicle 1 is traveling straight.

For example, as illustrated in FIG. 5, controller 60 may determine that the compression level "1" is to be applied to center segment 200C as the first partial region. In addition, controller 60 may determine that the compression level "2" is to be applied to left segment 200L, right segment 200R, and lower segment 200D, which are different from the first partial region. Furthermore, controller 60 may determine that the compression level "3" is to be applied to lower left segment 200LD and lower right segment 200RD. Moreover, controller 60 may determine that the compression level "4" is to be applied to upper segment 200U. Furthermore, controller 60 may determine that the compression level "5" is to be applied to upper left segment 200LU and upper right segment 200RU. The reason why the compression levels of upper left segment 200LU and upper right segment 200RU are set high (in other words, the number of pixels thereof are set small) is that while traveling straight, images of the sky, the ceiling of a tunnel, and the like are mostly captured in segments 200LU and 200RU, meaning that the level of significance in detecting an object in segments 200LU and 200RU is low.

<When Determined as Steering Right>

When the travel scene is determined as steering right, controller 60 sets, as the first partial region, one or more segments 200 including pixel 90 that receives light from a steering direction (from the right side) of vehicle 1. Furthermore, controller 60 determines that the resolution of one or more segments 200 other than the first partial region is to be set lower than the resolution of the first partial region while maintaining the resolution of one or more segments 200 belonging to the first partial region. In other words, controller 60 may determine the compression ratio of each segment 200 so that the compression ratio of segment(s) 200 belonging to the first partial region becomes lowest. This is because it is preferable that an object on the right side in front of vehicle 1 be accurately detected in a short time while steering right.

For example, as illustrated in FIG. 5, controller 60 may determine that the compression level "1" is to be applied to right segment 200R as the first partial region. In addition, controller 60 may determine that the compression level "2" is to be applied to center segment 200C, lower right segment 200RD, and left segment 200L, which are different from the first partial region. Furthermore, controller 60 may determine that the compression level "3" is to be applied to lower segment 200D and lower left segment 200LD. Moreover, controller 60 may determine that the compression level "4" is to be applied to upper right segment 200RU. Furthermore, controller 60 may determine that the compression level "5" is to be applied to upper segment 200U and upper left segment 200LU.

<When Determined as Steering Left>

When the travel scene is determined as steering left, controller 60 sets, as the first partial region, one or more segments 200 including pixel 90 that receives light from a steering direction (from the left side) of vehicle 1. Furthermore, controller 60 determines that the resolution of one or more segments 200 other than the first partial region is to be set lower than the resolution of the first partial region while maintaining the resolution of segment(s) 200 belonging to the first partial region. In other words, controller 60 may determine the compression ratio of each segment 200 so that the compression ratio of segment(s) 200 for the first partial region becomes lowest. This is because it is preferable that an object on the left side in front of vehicle 1 be accurately detected in a short time while steering left.

For example, as illustrated in FIG. 5, controller 60 may determine that the compression level "1" is to be applied to left segment 200L as the first partial region. In addition, controller 60 may determine that the compression level "2" is to be applied to center segment 200C, lower left segment 200LD, and right segment 200R, which are different from the first partial region. Furthermore, controller 60 may determine that the compression level "3" is to be applied to lower segment 200D and lower right segment 200RD. Moreover, controller 60 may determine that the compression level "4" is to be applied to upper left segment 200LU. Furthermore, controller 60 may determine that the compression level "5" is to be applied to upper segment 200U and upper right segment 200RU.

<When Determined as Traveling Almost at Top of Uphill>

When the travel scene is determined as traveling almost at the top of an uphill, controller 60 sets, as the first partial region, one or more segments 200 including pixel 90 that receives light at a downward angle with respect to a traveling direction of vehicle 1. Furthermore, controller 60 determines that the resolution of one or more segments 200 other than the first partial region is to be set lower than the resolution of the first partial region while maintaining the resolution of segment(s) 200 belonging to the first partial region. In other words, controller 60 may determine the compression ratio of each segment 200 so that the compression ratio of segment(s) 200 belonging to the first partial region becomes lowest. This is because it is preferable that an object at a downward angle with respect to the traveling direction of vehicle 1 be accurately detected in a short time while traveling almost at the top of an uphill.

For example, as illustrated in FIG. 5, controller 60 may determine that the compression level "1" is to be applied to lower segment 200D as the first partial region. In addition, controller 60 may determine that the compression level "2" is to be applied to center segment 200C, lower left segment 200LD, and lower right segment 200RD, which are different from the first partial region. Furthermore, controller 60 may determine that the compression level "3" is to be applied to left segment 200L and right segment 200R. Moreover, controller 60 may determine that the compression level "4" is to be applied to upper segment 200U. Furthermore, controller 60 may determine that the compression level "5" is to be applied to upper left segment 200LU and upper right segment 200RU.

<When Determined as Traveling Almost at Bottom of Downhill>

When the travel scene is determined as traveling almost at the bottom of a downhill, controller 60 sets, as the first partial region, one or more segments 200 including pixel 90 that receives light at an upward angle with respect to a traveling direction of vehicle 1. Furthermore, controller 60 determines that the resolution of one or more segments 200 other than the first partial region is to be set lower than the resolution of the first partial region while maintaining the resolution of segment 200 belonging to the first partial region. In other words, controller 60 may determine the compression ratio of each segment 200 so that the compression ratio of segment 200 belonging to the first partial region becomes lowest. This is because it is preferable that an object at an upward angle with respect to the traveling direction of vehicle 1 be accurately detected in a short time while traveling almost at the bottom of a downhill.

For example, as illustrated in FIG. 5, controller 60 may determine that the compression level "1" is to be applied to upper segment 200U serving as the first partial region. In addition, controller 60 may determine that the compression level "2" is to be applied to center segment 200C, upper left segment 200LU, and upper right segment 200RU, which are different from the first partial region. Furthermore, controller 60 may determine that the compression level "3" is to be applied to left segment 200L and right segment 200R. Moreover, controller 60 may determine that the compression level "4" is to be applied to lower segment 200D. Furthermore, controller 60 may determine that the compression level "5" is to be applied to lower left segment 200LD and lower right segment 200RD.

As described above, control unit 60 reads signals from the pixels aligned on image sensor 30 to a built-in memory in accordance with the compression level of each segment determined by control unit 60 itself. Specifically, the pixels belonging to segment 200 which serves as the first partial region and to which the compression level "1" is applied are read without skipping. Among the pixels belonging to segment 200 which does not serve as the first partial region and to which the compression level "2" is applied, one of two pixels in one of the horizontal direction and the vertical direction is read. Among the pixels belonging to segments 200 which do not serve as the first partial region and to which the compression levels "3" and "4" are applied, a pixel which is one of two pixels in the horizontal direction and is one of two pixels in the vertical direction is read. Among the pixels belonging to segment 200 which does not serve as the first partial region and to which the compression level "5" is applied, a pixel which is one of two pixels in one of the horizontal direction and the vertical direction, and is one of four pixels in the other direction is read. Pixel signals read in this method are read out to the memory of control unit 60, and thus compressed image data is generated. This compressed image data is transmitted from the memory to image processing device 12 via network 20 under control of control unit 60. Note that although the present exemplary embodiment describes a configuration in which the pixel signals are read out to the built-in memory, it is also possible to adopt a configuration in which necessary outputs are selected from the outputs from pixels of the image sensor so that the compressed output is directly read out.

FIG. 6 is a diagram illustrating image format information determined based on the travel information.

At the time of outputting the compressed image data, controller 60 additionally outputs image format information including information about the resolution of each segment 200. Specifically, the image format information includes information required for an image processor which receives the output to properly decompress the compressed image data. With the image format information, ECU 12 which receives the output compressed image data can generate one combined image data by appropriately combining the image data in segments 200 having different resolutions. Note that the image format information may be transmitted from DSP 32 in a blanking period (preferably in a vertical blanking period) of the output signal of the compressed image data.

For example, as illustrated in FIG. 6, the image format information may include the total resolution of the uncompressed image data obtained from image sensor 30, the total resolution of the compressed image data, the number of segments in the vertical direction and the number of segments in the horizontal direction, and the horizontal and vertical resolutions of each of the segments.

The total resolution before compression represents the resolution (horizontal resolution×vertical resolution) of the uncompressed image data. In the case of FIG. 5, the resolution before compression is "1920 pixels wide by 1080 pixels high".

The total resolution after compression represents the resolution (horizontal resolution×vertical resolution) of the compressed image data. In the case of FIG. 5, the resolution of the compressed image data is "1280 pixels wide by 630 pixels high".

The number of segments in the vertical direction and the number of segments in the horizontal direction represents the matrix of segments 200 (the horizontal number of segments×the vertical number of segments). In the case of FIG. 5, the matrix of segments is "3×3".

The horizontal resolution of each of the segments represents the horizontal resolution of each of the segments with respect to the horizontal resolution after compression. In the case of FIG. 5, the horizontal resolution of each of the segments depends on the determination result of the travel information.

The vertical resolution of each of the segments represents the vertical resolution of each of the segments with respect to the vertical resolution after compression. In the case of FIG. 5, the vertical resolution of each of the segments depends on the determination result of the travel information.

<When Determined as Traveling Straight>

When the travel scene is determined as traveling straight, controller 60 may set the horizontal resolutions of the segments to "320, 640, 320" in the left-to-right sequence, and the vertical resolutions of the segments to "90, 360, 180" in the downward sequence, as illustrated in FIG. 6, for example.

<When Determined as Steering Right>

When the travel scene is determined as steering right, controller 60 may set the horizontal resolutions of the segments to "320, 320, 640" in the left-to-right sequence, and the vertical resolutions of the segments to "90, 360, 180" in the downward sequence, as illustrated in FIG. 6, for example.

<When Determined as Steering Left>

When the travel scene is determined as steering left, controller 60 may set the horizontal resolutions of the segments to "640, 320, 320" in the left-to-right sequence, and the vertical resolutions of the segments to "90, 360, 180" in the downward sequence, as illustrated in FIG. 6, for example.

<When Determined as Traveling Almost at Top of Uphill>

When the travel scene is determined as traveling almost at the top of an uphill, controller 60 may set the horizontal resolutions of the segments to "320, 640, 320" in the left-to-right sequence, and the vertical resolutions of the segments to "90, 180, 360" in the downward sequence, as illustrated in FIG. 6, for example.

<When Determined as Traveling Almost at Bottom of Downhill>

When the travel scene is determined as traveling almost at the bottom of a downhill, controller 60 may set the horizontal resolutions of the segments to "320, 640, 320" in the left-to-right sequence, and the vertical resolutions of the segments to "360, 180, 90" in the downward sequence, as illustrated in FIG. 6, for example.

<Other Travel States>

Controller 60 may determine, based on travel information 100 including an indicated direction, whether the travel state of vehicle 1 is "turning right" or "turning left". The indicated direction is transmitted by a direction indicator which is an embodiment of travel information transmission device 14. When the travel scene is determined as turning right, controller 60 may perform substantially the same process as the above-described process performed when the travel scene is determined as steering right. When the travel scene is determined as turning left, controller 60 may perform substantially the same process as the above-described process performed when the travel scene is determined as steering left.

<Compression Level Determination Condition>

Controller 60, which develops compressed image data of a plurality of frames in the memory therein, may determine the compression ratio of each segment 200 so that the compressed image data of these plurality of frames have the same total resolution. For example, controller 60 may determine the compression ratio (or the horizontal and vertical resolutions) of each segment so that the resolutions of all the output compressed image frames after compression in the example in FIG. 6 become the same.

In the example in FIG. 5, controller 60 determines the compression level "1" for one segment 200, the compression level "2" for three segments 200, the compression level "3" for two segments 200, the compression level "4" for one segment 200, and the compression level "5" for two segments 200 among nine segments 200 regardless of a change in the travel scene. Specifically, controller 60 determines the compression level of each image so that the total resolution of the output compressed image frame is 1280 pixels wide by 630 pixels high (approximately 810,000 pixels) at any point in time. This makes the data transmission rate for compressed image frames that are output from controller 60 constant. Thus, it is possible to reduce the processing load or simplify the configuration on the image processing device (ECU 12) which receives and processes the compressed image frame.

<Functional Configuration of Image Processing Device>

Figure 7:
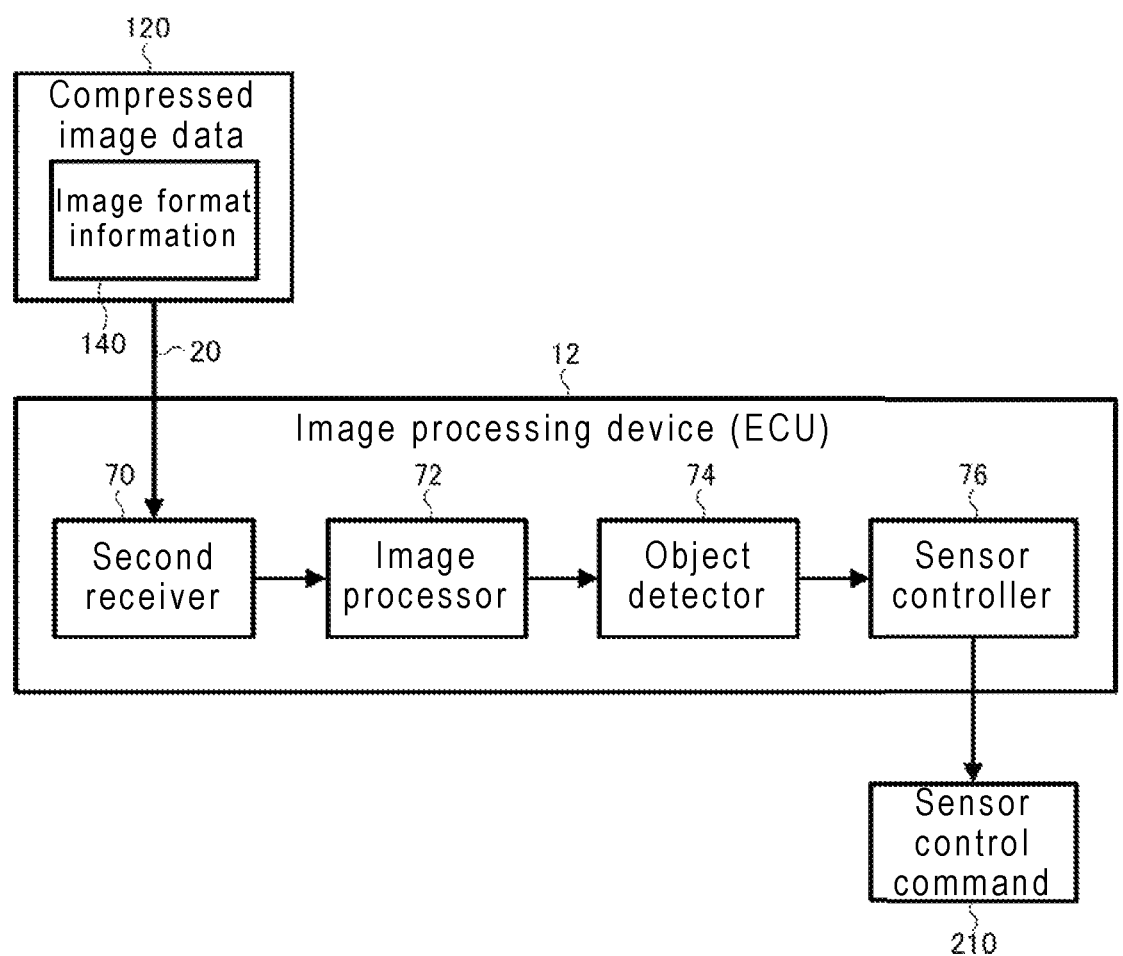
FIG. 7 is a diagram illustrating function blocks of the image processing device.

FIG. 7 is a diagram illustrating function blocks of the image processing device.

ECU 12 which is an example of the image processing device may include second receiver 70, image processor 72, object detector 74, and sensor controller 76 as functions.

<Second Receiver>

Second receiver 70 receives, via network 20, compressed image data 120 and image format information 140 in the memory included in DSP 32 of imaging device 10. Note that second receiver 70 may directly receive compressed image data 120 and image format information 140 from DSP 32, not via the memory. Furthermore, in the case where ECU 12 and DSP 32 are integrated, ECU 12 does not need to include second receiver 70.

<Image Processor>

Image processor 72 generates decompressed image data by converting, based on image format information 140 received by second receiver 70, the resolution of each segment 200 in compressed image data 120 received by second receiver 70.

For example, image processor 72 generates image data of 640 pixels wide by 360 pixels high, which is the same as the resolution of uncompressed segment 200, by doubling each of the horizontal and vertical resolutions of compressed segment 200 having a resolution of 320 pixels wide by 180 pixels high. For other compressed segments 200, image processor 72 likewise generates image data having a resolution of 640 pixels wide and 360 pixels high through substantially the same process. Furthermore, by combining the generated image data, image processor 72 generates combined image data having a resolution of 1920 pixels wide by 1080 pixels high which corresponds to the original full HD. Note that the process for increasing the resolution may be referred to as a "decompression process".

At the time of increasing the resolution (that is, increasing the number of pixels) of the compressed image data, image processor 72 may complement the pixels using what is called the super-resolution technique.

First Modified Example of Image Processor

Figure 8:
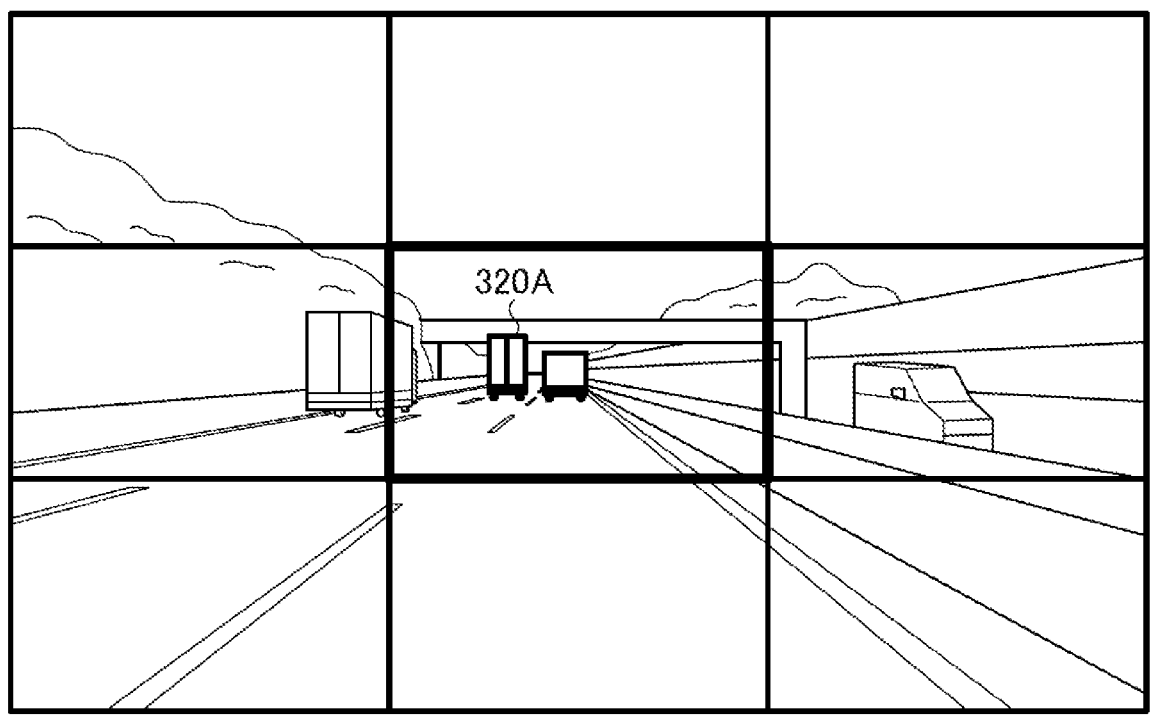
FIG. 8 is a diagram for describing a modified example of a process for converting a resolution.

FIG. 8 is a diagram for describing a variation of the process for converting the resolution.

In the above-described decompression process, the resolution of every segment is adjusted to match the resolution of the uncompressed segment. This is, however, not limiting the present disclosure; the decompression process may be performed by uniformly applying, as the resolution of every segment, a predetermined resolution (hereinafter referred to as an "intermediate resolution") between a first resolution which is highest and a second resolution which is lowest.

In this case, the resolution of a segment higher than the intermediate resolution is reduced to the intermediate resolution. However, if the resolution is simply reduced, an object that is detectable when the resolution is high (typically, an object appearing small in the captured image) may be lost or become unclear due to the reduction in resolution, and thus the object may become undetectable by object detector 74 to be described later. Therefore, image processor 72 performs image processing on the image data of segment 200 before the resolution thereof has not yet been reduced to emphasize a predetermined characteristic portion (for example, a predetermined portion of an object that is characteristic). For example, as illustrated in FIG. 8, image processor 72 emphasizes pixels around pixels 320A in the predetermined characteristic portion. Thereafter, image processor 72 reduces the resolutions of segments 200. This reduces the likelihood that due to the reduction in resolution, an object becomes undetectable by object detector 74 to be described later. Note that using what is called the super-resolution technique, in substantially the same manner as that described above, image processor 72 may increase the number of pixels of segment 200 having a resolution lower than the intermediate resolution until the resolution reaches the intermediate resolution.

Second Modified Example of Image Processor

Figure 9:
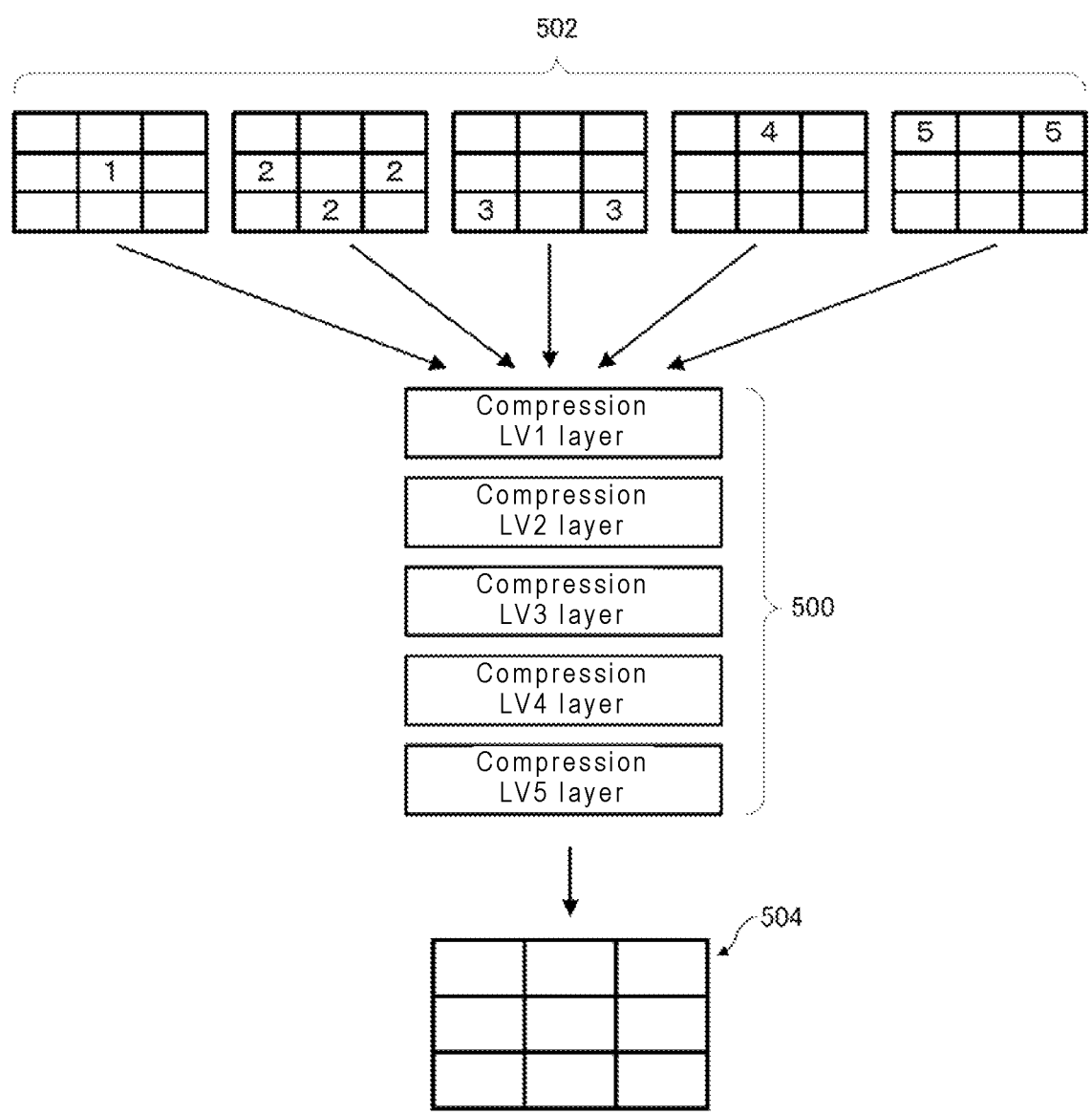
FIG. 9 is a diagram illustrating a configuration example of deep learning layers.

FIG. 9 is a diagram illustrating a configuration example of a deep learning layer.

As described above, it is preferable that the compressed image data be decompressed (the number of pixels be increased) so that the accuracy of the detection of an object by object detector 74 to be described later improves. Therefore, it is preferable that image processor 72 include deep learning layers 500 in accordance with the resolutions of the plurality of segments 200, as illustrated in FIG. 9. Image processor 72 preferably optimizes deep learning layers 500 by learning at least a change in the resolution of each of the plurality of segments 200 or the object detection result, for example, based on the travel information of vehicle 1. Specific details are as follows.

Image processor 72 receives, as input data 502, the positions of segments 200 (such as center segment 200C and left segment 200L according to the present embodiment), travel information 100, and pieces of image data that are captured in segments 200 located at the positions and have different number of pixels. In addition, image processor 72 outputs, as output data 504, image data decompressed using deep learning layers 500. Subsequently, deep learning layer 500 is trained on the basis of the success and failure in detecting an object from the decompressed image data.

By decompressing the image data in each segment 200 using deep learning layers 500 trained in this manner, image processor 72 can generate, for each segment 200, decompressed image data from which an object is detected with high accuracy.

<Object Detector>

Object detector 74 detects a predetermined object from the image data generated by image processor 72. In other words, object detector 74 determined whether or not the predetermined object is captured in the image data of which the resolution is converted by image processor 72. The predetermined object may be an object associated with the travel of vehicle 1 such as another vehicle which is an example of another movable-body apparatus, a pedestrian, a traffic sign, or the like.

The combined image data generated by image processor 72 has no image quality deterioration (uncompressed) or reduced image quality deterioration (lightly compressed) within segment 200 determined as relatively important through the process of controller 60 in DSP 32 based on travel information 100. Thus, object detector 74 can accurately detect an object in a shorter time. For example, in the case of simply compressed image data, more than one combined image frame (that is, a long time) is required to detect an object; in contrast, in the case of the image data according to the present embodiment, relatively important segment 200 is high in image quality, and thus there is a higher likelihood that an object can be detected from one image frame.

<Sensor Controller>

Figure 10:
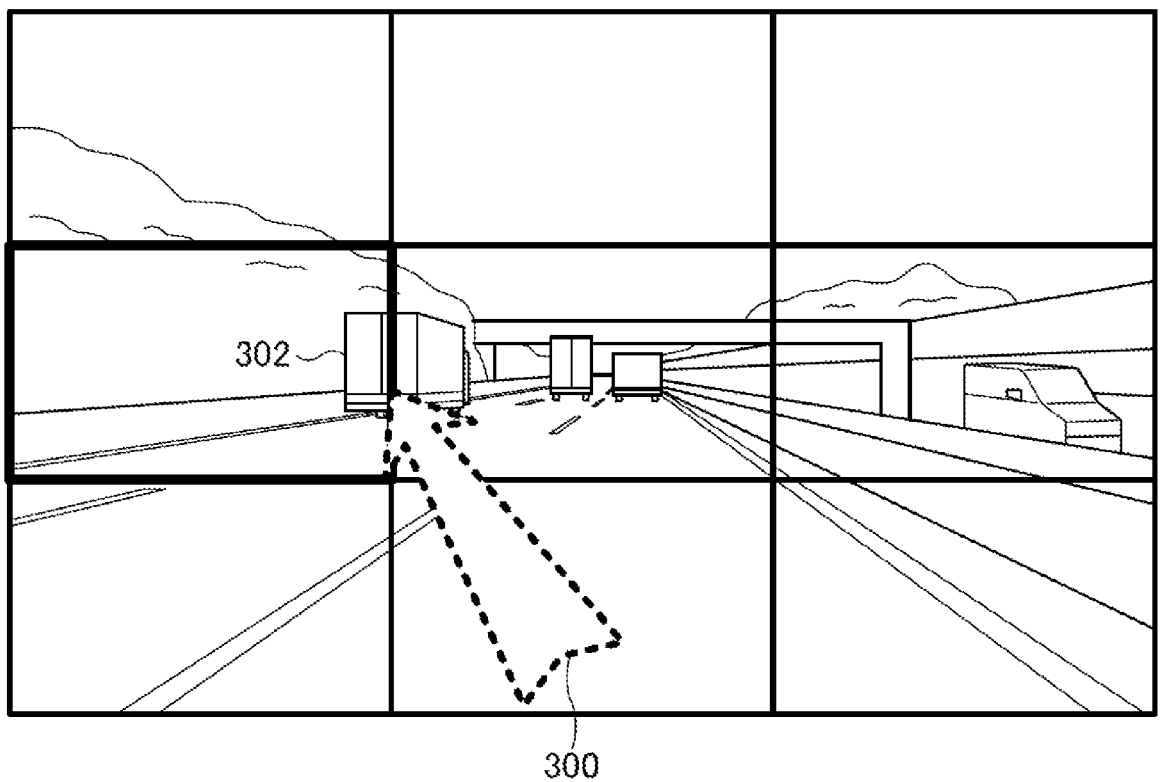
FIG. 10 is a diagram illustrating a change in a sensing method based on an object detection result.

FIG. 10 is a diagram illustrating a change in a sensing method based on an object detection result.

Sensor controller 76 changes the sensing method in active sensor 16 in accordance with the result of object detection by object detector 74. In other words, when object detector 74 detected that the predetermined object is captured in the image data of which the resolution is converted by image processor 72, sensor controller 76 controls active sensor 16 based on the detection result. For example, sensor controller 76 transmits sensor control command 210 for controlling active sensor 16 to active sensor 16 and changes the sensing method in active sensor 16. As described above, object detector 74 can accurately detect an object in a shorter time, and thus sensor controller 76 can accurately transmit appropriate sensor control command 210 in a shorter time.

FIG. 10 shows an example in the case where active sensor 16 is a distance measurement sensor which emits millimeter waves 300 (which may be laser light) to measure the distance between vehicle 1 and an object. In the example in FIG. 10, it is assumed that from the image data, object detector 74 detects another vehicle 302, which is an example of another movable-body apparatus, in a position on the left side of the center point of image sensor 30. In this case, sensor controller 76 may transmit, to active sensor 16, sensor control command 210 indicating that the direction in which millimeter waves 300 are emitted is to be changed to the left. With this control, ECU 12 can more accurately measure the distance between vehicle 1 and another vehicle 302 in a shorter time.

An example of active sensor 16 is a time of flight (TOF) sensor. On the basis of a time difference (or a phase difference) between the transmission timing of emitted waves and the reception timing of reflected waves resulting from the emitted waves being reflected by an object, the TOF sensor measures the distance between the object and the TOF sensor. Therefore, the distance between vehicle 1 and another vehicle 302 in the example in FIG. 10 may be measured using the TOF sensor. Note that the configuration for measuring the distance may be implemented by replacing the light reception by the TOF sensor by direct light reception by image sensor 30.

Note that image processor 72 may be configured to include the functions of object detector 74 and sensor controller 76.

Modified Example of Segments for Image Sensor

Figure 11:
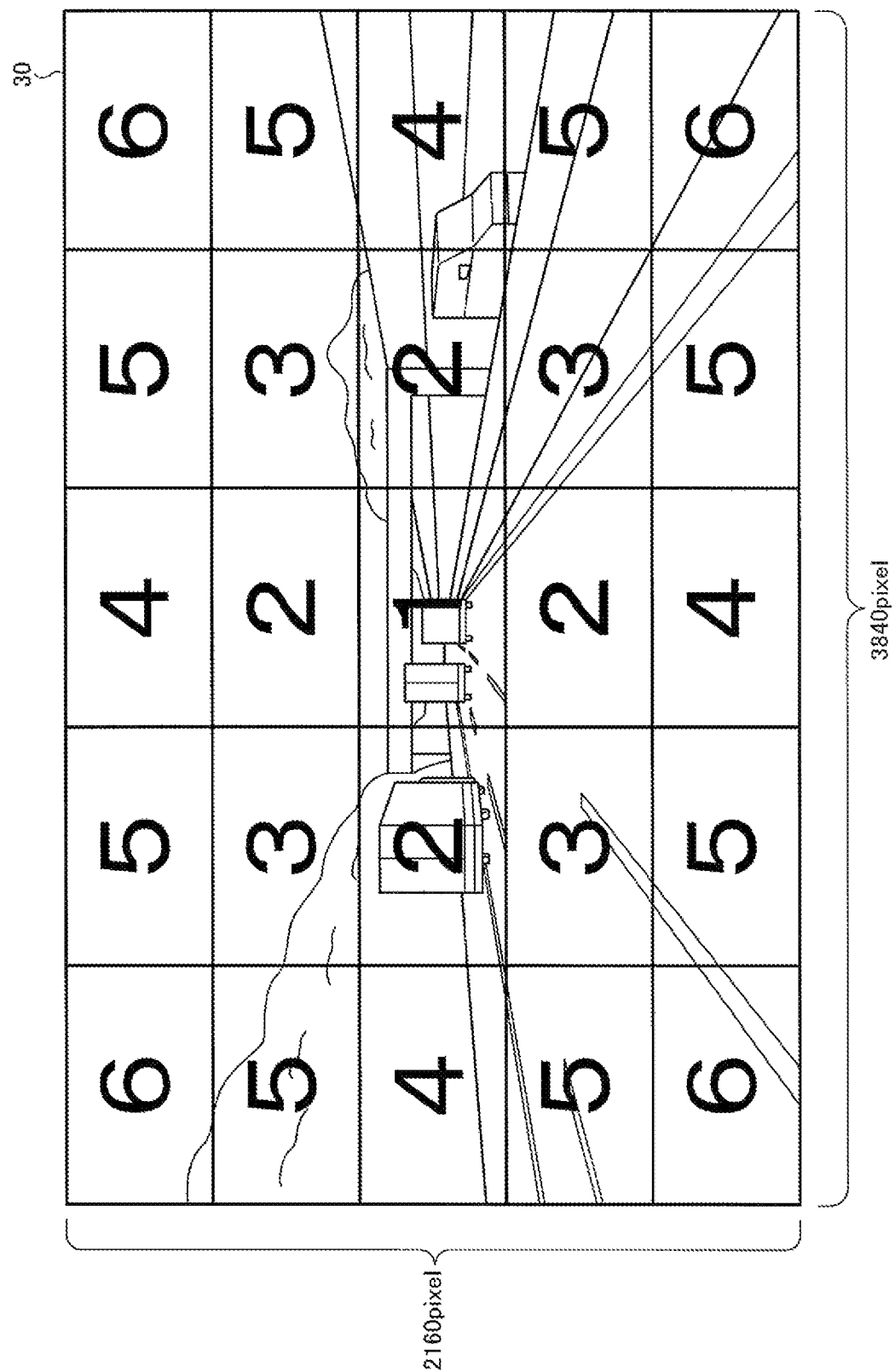
FIG. 11 is a diagram illustrating a modified example of segments configured for the image sensor.

FIG. 11 illustrates a modified example of segments configured for image sensor 30.

The number of segments 200 configured for image sensor 30 is not limited to nine such as that illustrated in FIG. 3. For example, as illustrated in FIG. 11, in an image sensor including a pixel array measuring 3840 pixels wide by 2160 pixels high (approximately 8,200,000 pixels), 25 segments may be formed by horizontally and vertically dividing the pixels into five equal portions. The compression level information in this case may be defined as follows.

The number of pixels in a segment for which the compression level is determined as "1" is maintained (no compression is applied). In the example in FIG. 11, the resolution of the compressed segment is 768 pixels wide by 432 pixels high (corresponding to "4K").

The number of pixels in a segment for which the compression level is determined as "2" is reduced (compressed) by half. In the example in FIG. 11, the resolution of the compressed segment is 384 pixels wide by 432 pixels high or 768 pixels wide by 216 pixels high (corresponding to "full HD+").

The number of pixels in a segment for which the compression level is determined as "3" is reduced (compressed) by one-fourth. In the example in FIG. 11, the resolution of the compressed segment is 384 pixels wide by 216 pixels high (corresponding to "full HD").

The number of pixels in a segment for which the compression level is determined as "4" is reduced (compressed) by one-fourth. In the example in FIG. 11, the resolution of the compressed segment is 768 pixels wide by 108 pixels high or 192 pixels wide by 432 pixels high (corresponding to "HD+").

The number of pixels in a segment for which the compression level is determined as "5" is reduced (compressed) by one-eighth. In the example in FIG. 11, the resolution of the compressed segment is 384 pixels wide by 108 pixels high or 192 pixels wide by 216 pixels high (corresponding to "HD").

The number of pixels in a segment for which the compression level is determined as "6" is reduced (compressed) by one-sixteenth. In the example in FIG. 11, the resolution of the compressed segment is 192 pixels wide by 108 pixels high (corresponding to "HD−").

Furthermore, in the example in FIG. 11, when the travel scene is determined as "traveling straight", controller 60 may determine, as the compression level of each segment, the numerical value indicated in the segment in FIG. 11. At this time, similar to the previously-described case, controller 60 may determine the compression level of each segment so that the resolution of the output compressed image frame is 1920 pixels wide by 1080 pixels high (approximately 2,070,000 pixels) in every output.

Additional Remarks

Figure 12:
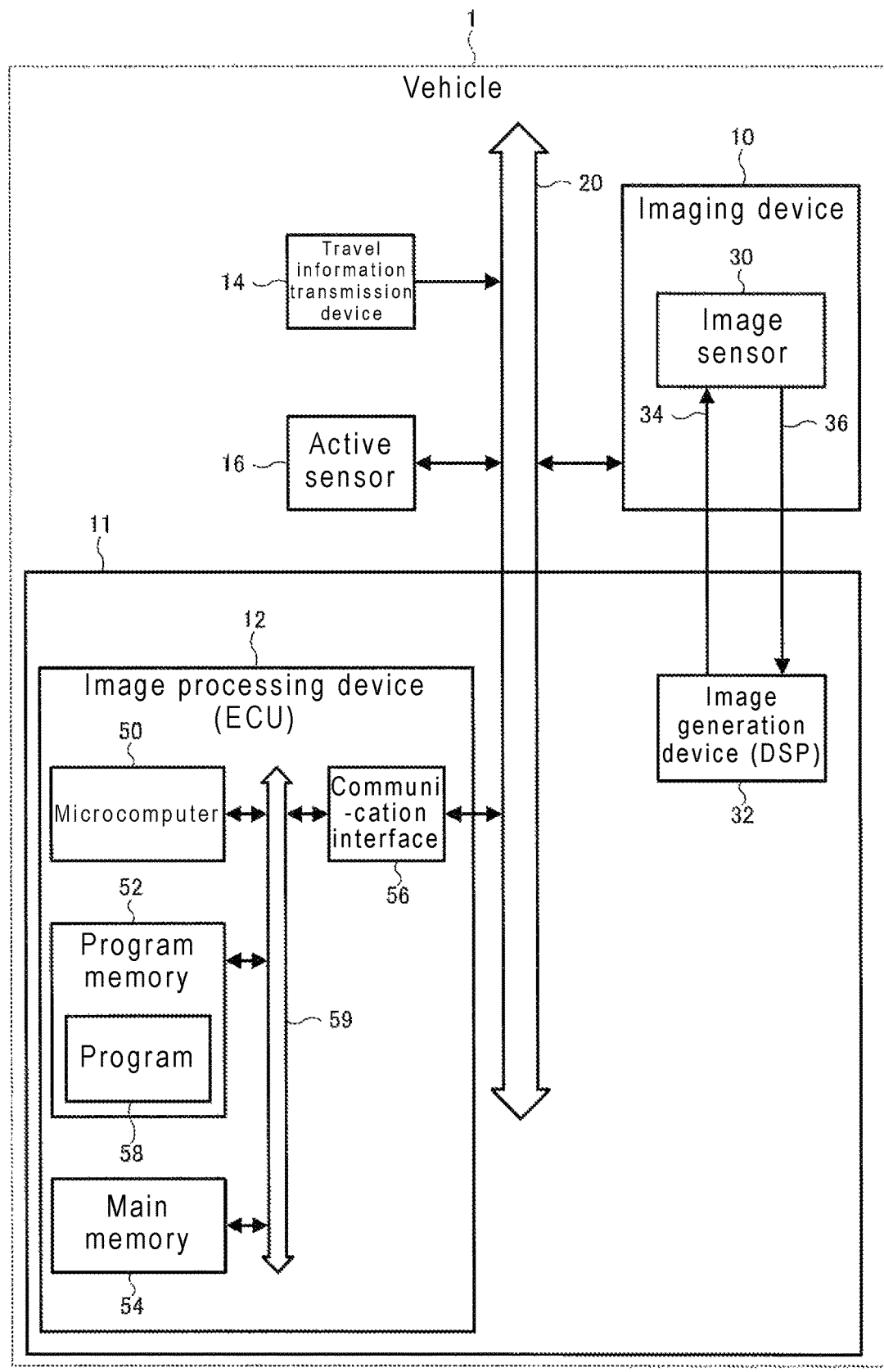
FIG. 12 is a diagram illustrating a modified example of hardware configurations of an image generation device and an image processing device according to the embodiment of the present disclosure.

FIG. 12 is a diagram illustrating a modified example of hardware configurations of the image generation device and the image processing device according to the embodiment of the present disclosure.

As illustrated in the example in FIG. 12, image generation device (DSP) 32 may be disposed outside of image sensor 30. Furthermore, image generation device (DSP) 32 and image processing device (ECU) 12 may constitute a single device (chip). The above-described exemplary embodiment may be implemented using image processing system 11 including image generation device (DSP) 32 and image processing device (ECU 12). Furthermore, controller 60 in image generation device 32 and each element in image processing device 12 may be implemented using a computer program, respectively. The computer program may be stored in a distributed medium such as a digital versatile disc (DVD) and provided, or may be stored in a server device on a network so as to be downloadable through the network.

Note

Each of the above exemplary embodiment and the modified examples is merely an example of an implementation embodiment of the present disclosure and should not give the technical scope of the present disclosure a limited interpretation. This means that the present disclosure can be implemented in various forms without departing from the essence or the major features of the present disclosure.

As described above, the image generation device, the image generation method, the program, the recording medium, and the image processing system according to the present disclosure in which captured image data can be appropriately compressed are favorably used for an imaging device, a device mounted to a movable-body apparatus, or the like.

What is claimed is:

1. An image processing system comprising:
an image generation device including:
a receiver which, in operation, receives travel information about a travel state of a movable-body apparatus; and
a controller which, in operation, selects, based on the travel information received by the receiver, a first partial region from an entirety of a plurality of pixels of an image sensor or an entirety of image data captured by the image sensor, and generates image data in which a region other than the first partial region has a resolution lower than a resolution of the first partial region, the image sensor being configured to be mounted to the movable-body apparatus and being configured to capture an area in a traveling direction of the movable-body apparatus; and
an image processing device which, in operation, converts the resolution of the image data,
wherein the image processing device is configured to be connected to an active sensor which detects an object around the active sensor based on a return wave resulting from a predetermined wave emitted from the active sensor and then returning to the active sensor, the image processing device being operable to communicate with the active sensor, and
when the image processing device detects that a predetermined object is captured in the image data having the resolution converted by the image processing device, the image processing device controls the active sensor based on a detection result.

2. The image processing system according to claim 1, wherein each of the plurality of pixels of the image sensor belongs to one of a plurality of segments that are predetermined or the entirety of image data is divided into the plurality of segments that are predetermined,
the controller determines a resolution of each of the plurality of segments based on the travel information to make a resolution of at least a part of the region other than the first partial region lower than the resolution of the first partial region,
the plurality of segments includes one or more segments belonging to the region other than the first partial region and one or more segments belonging to the first partial region, and
the controller generates image data in which a resolution of the one or more segments belonging to the region other than the first partial region is lower than a resolution of the one or more segments belonging to the first partial region.

3. The image processing system according to claim 2, wherein the controller further generates image format information of the image data, and
the image format information includes at least a resolution of an image obtained from the image sensor, the resolution of the image data, a total number of the plurality of segments, and the resolution of each of the plurality of segments.

4. The image processing system according to claim 3, wherein the image processing device converts the resolution of the image data based on the image format information.

5. The image processing system according to claim 3, wherein the image generation device transmits the image format information to a transmission path in a vertical blanking period for the image data.

6. The image processing system according to claim 5, wherein in the image data, at least two of the plurality of segments respectively have a first resolution and a second resolution that are different from each other; and
after performing image processing to emphasize a predetermined characteristic portion in the image data, the image processing device converts the resolution of each of the plurality of segments of the image data into an intermediate resolution having an intermediate value between the first resolution and the second resolution.

7. The image processing system according to claim 3, wherein the image processing device includes deep learning layers corresponding to resolutions of the plurality of segments and converts the resolution of the image data based on the image format information while optimizing the deep learning layers by learning at least changes in the resolutions of the plurality of segments based on the travel information of the movable-body apparatus.

8. An image generation device comprising:
a receiver which, in operation, receives travel information about a travel state of a movable-body apparatus; and
a controller which, in operation, selects, based on the travel information received by the receiver, a first partial region from an entirety of a plurality of pixels of an image sensor or an entirety of image data captured by the image sensor, and generates image data in which a region other than the first partial region has a resolution lower than a resolution of the first partial region, the image sensor being configured to be mounted to the movable-body apparatus and being configured to capture an area in a traveling direction of the movable-body apparatus,
wherein each of the plurality of pixels of the image sensor belongs to one of a plurality of segments that are predetermined or the entirety of image data is divided into the plurality of segments that are predetermined,
the controller determines a resolution of each of the plurality of segments based on the travel information to make a resolution of at least a part of the region other than the first partial region lower than the resolution of the first partial region,
the plurality of segments includes one or more segments belonging to the region other than the first partial region and one or more segments belonging to the first partial region,
the controller generates the image data in which a resolution of the one or more segments belonging to the region other than the first partial region is lower than a resolution of the one or more segments belonging to the first partial region, and
when the controller determines, based on the travel information, that the movable-body apparatus has almost reached one of a top of an upslope and a bottom of a downslope, the controller sets, as the first partial region, one of the plurality of segments that includes a pixel receiving light at one of a downward angle and an upward angle of the movable-body apparatus among the plurality of pixels.

9. The image generation device according to claim 8, wherein, when the controller determines, based on the travel information, that the movable-body apparatus is traveling straight, the controller sets, as the first partial region, one of the plurality of segments that includes a pixel receiving at least light from straight ahead among the plurality of pixels.

10. The image generation device according to claim 8, wherein, when the controller determines, based on the travel information, that the movable-body apparatus is steering through a turn, the controller sets, as the first partial region, one of the plurality of segments that includes a pixel receiving light from a steering direction of the movable-body apparatus among the plurality of pixels.

11. The image generation device according to claim 8, wherein the controller further includes a memory and develops image data of a plurality of frames in the memory, and the image data of the plurality of frames have total resolutions equal to one another.

12. An image generation device comprising:
a receiver which, in operation, receives travel information about a travel state of a movable-body apparatus; and
a controller which, in operation, selects, based on the travel information received by the receiver, a first partial region from an entirety of a plurality of pixels of an image sensor or an entirety of image data captured by the image sensor, and generates image data in which a region other than the first partial region has a resolution lower than a resolution of the first partial region, the image sensor being configured to be mounted to the movable-body apparatus and being configured to capture an area in a traveling direction of the movable-body apparatus,
wherein each of the plurality of pixels of the image sensor belongs to one of a plurality of segments that are predetermined or the entirety of image data is divided into the plurality of segments that are predetermined,
the controller determines a resolution of each of the plurality of segments based on the travel information to make a resolution of at least a part of the region other than the first partial region lower than the resolution of the first partial region,
the plurality of segments includes one or more segments belonging to the region other than the first partial region and one or more segments belonging to the first partial region,
the controller generates the image data in which a resolution of the one or more segments belonging to the region other than the first partial region is lower than a resolution of the one or more segments belonging to the first partial region,
the controller further generates image format information of the image data, and
the image format information includes at least a resolution of an image obtained from the image sensor, the resolution of the image data, a total number of the plurality of segments, and the resolution of each of the plurality of segments.

13. The image generation device according to claim 12, wherein, when the controller determines, based on the travel information, that the movable-body apparatus is traveling straight, the controller sets, as the first partial region, one of the plurality of segments that includes a pixel receiving at least light from straight ahead among the plurality of pixels.

14. The image generation device according to claim 12, wherein, when the controller determines, based on the travel information, that the movable-body apparatus is steering through a turn, the controller sets, as the first partial region, one of the plurality of segments that includes a pixel receiving light from a steering direction of the movable-body apparatus among the plurality of pixels.

15. The image generation device according to claim 12, wherein the controller further includes a memory and develops image data of a plurality of frames in the memory, and the image data of the plurality of frames have total resolutions equal to one another.

16. An image processing system comprising:
an image generation device including:
a receiver which, in operation, receives travel information about a travel state of a movable-body apparatus; and a controller which, in operation, selects, based on the travel information received by the receiver, a first partial region from an entirety of a plurality of pixels of an image sensor or an entirety of image data captured by the image sensor, and generates image data in which a region other than the first partial region has a resolution lower than a resolution of the first partial region, the image sensor being configured to be mounted to the movable-body apparatus and being configured to capture an area in a traveling direction of the movable-body apparatus; and an image processing device which, in operation, converts the resolution of the image data, wherein each of the plurality of pixels of the image sensor belongs to one of a plurality of segments that are predetermined or the entirety of image data is divided into the plurality of segments that are predetermined, the controller determines a resolution of each of the plurality of segments based on the travel information to make a resolution of at least a part of the region other than the first partial region lower than the resolution of the first partial region, the plurality of segments includes one or more segments belonging to the region other than the first partial region and one or more segments belonging to the first partial region, the controller generates image data in which a resolution of the one or more segments belonging to the region other than the first partial region is lower than a resolution of the one or more segments belonging to the first partial region, the controller further generates image format information of the image data, and the image format information includes at least a resolution of an image obtained from the image sensor, the resolution of the image data, a total number of the plurality of segments, and the resolution of each of the plurality of segments.

17. The image processing system according to claim 16, wherein the image processing device converts the resolution of the image data based on the image format information.

18. The image processing system according to claim 16, wherein the image generation device transmits the image format information to a transmission path in a vertical blanking period for the image data.

19. The image processing system according to claim 18, wherein in the image data, at least two of the plurality of segments respectively have a first resolution and a second resolution that are different from each other; and after performing image processing to emphasize a predetermined characteristic portion in the image data, the image processing device converts the resolution of each of the plurality of segments of the image data into an intermediate resolution having an intermediate value between the first resolution and the second resolution.

20. The image processing system according to claim 16, wherein the image processing device includes deep learning layers corresponding to resolutions of the plurality of segments and converts the resolution of the image data based on the image format information while optimizing the deep learning layers by learning at least changes in the resolutions of the plurality of segments based on the travel information of the movable-body apparatus.

* * * * *